United States Patent [19]

Lam

[11] Patent Number: 4,665,417
[45] Date of Patent: May 12, 1987

[54] NON-VOLATILE DYNAMIC RANDOM ACCESS MEMORY CELL

[75] Inventor: Chung H. Lam, Troy, N.Y.

[73] Assignee: International Business Machines Corporation, Armonk, N.Y.

[21] Appl. No.: 856,443

[22] Filed: Apr. 23, 1986

Related U.S. Application Data

[63] Continuation of Ser. No. 655,176, Sep. 27, 1984, abandoned.

[51] Int. Cl.$^4$ .............................. H01U 29/78
[52] U.S. Cl. .................. 357/23.5; 357/23.6; 365/149; 365/184; 365/185
[58] Field of Search ............... 357/23.5, 23.6; 365/149, 184, 185

[56] References Cited

U.S. PATENT DOCUMENTS

| | | | |
|---|---|---|---|
| 3,825,946 | 7/1974 | Frohman-Bentchkowsky | 365/185 |
| 3,906,296 | 9/1975 | Maserjian et al. | 365/185 |
| 4,099,196 | 7/1978 | Simko | 357/23 |
| 4,104,675 | 8/1978 | DiMaria | 357/54 |
| 4,119,995 | 10/1978 | Simko | 357/23 |
| 4,274,012 | 1/1979 | Simko | 307/238.3 |
| 4,300,212 | 10/1981 | Simko | 365/185 |
| 4,314,265 | 2/1982 | Simko | 357/23 |
| 4,334,292 | 6/1982 | Kotecha | 365/182 |
| 4,336,603 | 6/1982 | Kotecha et al. | 365/182 |
| 4,363,110 | 12/1982 | Kalter et al. | 365/149 |
| 4,375,085 | 2/1983 | Grise et al. | 365/104 |
| 4,380,057 | 4/1983 | Kotecha et al. | 365/185 |
| 4,432,072 | 2/1984 | Chao et al. | 365/149 |
| 4,446,535 | 5/1984 | Gaffney et al. | 365/149 |
| 4,449,205 | 5/1984 | Hoffman | 365/182 |

OTHER PUBLICATIONS

Lee, "A New Approach for a Floating-Gate MOS Non-Volatile Memory", *Applied Phy. Letters*, vol. 31, No. 7, 10/77, pp. 475-476.

Hoffman, "Floating Gate Non-Volatile Memory Cell", *IBM Technical Bulletin*, vol. 22, No. 6, Nov. 1979, pp. 2403-2404.

*Primary Examiner*—Martin H. Edlow
*Attorney, Agent, or Firm*—Mark F. Chadurjian

[57] ABSTRACT

A non-volatile dynamic memory cell in which the non-volatile element has two different areas for electron injection, such that direct overwriting of previously stored non-volatile data is permitted without an intervening erase cycle. The non-volatile storage element is a floating gate electrode which has dual control gates disposed thereon. Each control gate includes a layer of dual electron injector structure (DEIS) and a polysilicon gate. When writing a "0" from the volatile storage capacitor to the floating gate, one of the programming gates removes charge from the floating gate. To write a "1", the other programming gate injects charge into the floating gate. The above charge transfer does not take place if the previously stored logic gate and the logic state to be written in are identical.

20 Claims, 4 Drawing Figures

NON-VOLATILE DYNAMIC RANDOM ACCESS MEMORY CELL

This is a continuation of co-pending application Ser. No. 655,176 filed on Sept. 27, 1984, now abandoned.

Cross Reference to Related Applications

Reference is made to co-pending U.S. patent application Ser. No. 655,175, J. P. Kasold et al, entitled, "Dual Gate EEPROM Cell" and Ser. No. 655,134, B. A. Kauffmann et al, entitled, "Non-Volatile Dynamic Random Access Memory Cell", filed Sept. 27, 1984 and assigned to the assignee of the present invention.

TECHNICAL FIELD OF THE INVENTION

The invention relates generally to the field of non-volatile dynamic random access memory cells.

BACKGROUND ART

Non-volatile floating-gate MOS memories are well known in the industry. In such devices, the conductive state of the transistor memory cell is determined by the voltage on an associated floating gate.

Designs have been proposed which facilitate the erasure and resetting of the voltages on these floating gates. For example, in U.S. Pat. No. 4,119,995 (issued Oct. 10, 1978 to Simko and assigned to Intel Corporation) the floating gate is controlled by separate programming and erasure gates which are disposed above the floating gate and insulated therefrom by an oxide layer. The floating gate voltage is programmed by electron injection from the substrate. The charge on the floating gate is erased by causing electrons to flow from the floating gate up to the erasing gate.

Other designs have been proposed which utilize charge transfer between the floating gate and one or more control gates to both erase and program the floating gate (i.e., in these designs the tunnelling or avalanche of electrons from a structure other than a substrate region is used to set the voltage of the floating gate). See e.g. Lee, "A New Approach for the Floating-Gate MOS Nonvolatile Memory", *Applied Physics Letters*, Vol. 31, No. 7, October 1977, pp. 475-476. This paper discloses a single control gate separated from the floating gate by a poly-oxide layer. When the control gate is biased positive for writing, electron flow is induced from the floating gate to the control gate. Since this flow is greater than the flow of electrons from the substrate to the floating gate, the floating gate accumulates positive charge. When the control gate is ramped negative to erase, the floating gate accumulates negative charge. See also U.S. Pat. Nos. 4,099,196; 4,274,012; 4,300,212; and 4,314,265 (issued 7/4/78, 1/24/79, 10/10/81 and 2/2/82, respectively, to Simko) which disclose erasable PROM's wherein a programming gate is disposed below the floating gate and an erasure gate is disposed above the floating gate. The devices are programmed by inducing electron flow from the program gate to the control gate and are erased by inducing electron flow from the floating gate to the erasing gate. In all four patents, the surface of one or more of the gates is roughened in order to enhance the induced electric fields. This promotes electron flow through the oxide layers separating the gates.

Among the materials which have charge injection properties is the so-called dual electron injector structure (DEIS), which is a layer of $SiO_2$ having excess silicon crystals on its upper and lower surfaces. This structure is disclosed in U.S. Pat. No. 4,104,675 (issued to DiMaria and assigned to the assignee of the present application). DEIS is generally formed by a chemical vapor deposition process which induces extra silicon crystal growth both prior and subsequent to the formation of an otherwise normal $SiO_2$ layer. Several patents specifically disclose the use of a DEIS layer as the injector structure for a non-volatile memory. See e.g., U.S. Pat. No. 4,336,603 (issued 6/22/82 and assigned to the assignee of the present application). This patent discloses a single control gate which injects electrons into the floating gate through a DEIS layer.

This DEIS layer has also been incorporated in providing the injector structure for the non-volatile component of a non-volatile dynamic RAM. See e.g. U.S. Pat. No. 4,446,535 (issued 5/1/84 to Gaffney et al and assigned to the assignee of the present application), which discloses the use of DEIS to construct a single control gate of a non-volatile element associated with (i.e. storing the "latent image" of) a dynamic RAM cell (DRAM). Such non-volatile DRAMs are also disclosed in U.S. Pat. Nos. 4,449,205 (issued 5/15/84 to Hoffman); 4,363,110 (issued 12/7/82 to Kalter et al); 4,432,072 (issued 2/14/84 to Chao et al) and 4,375,085 (issued 2/22/83 to Grise et al), all of which are assigned to the assignee of the present application. In each of these patents, the data stored on the floating gate is erased before new data can be stored thereon. This extra operational step adversely affects the operational speeds attainable in these memories.

SUMMARY OF THE INVENTION

It is an object of the present invention to provide an improved non-volatile dynamic random access memory cell.

It is another object of the invention to provide a non-volatile dynamic memory cell in which data can be written into the cell without first erasing the existing data stored thereon.

It is yet another object of the invention to provide a non-volatile dynamic RAM cell which needs a minimum of support circuitry.

These and other objects of the invention are realized by a non-volatile dynamic RAM cell in which the plate of the storage capacitor is coupled through a layer of DEIS material to an associated floating gate electrode. The floating gate is also coupled to a control gate electrode through a separate layer of DEIS material.

In operation, when a first binary logic state is written into the floating gate from the storage capacitor, the DEIS material induces electron flow from the floating gate to the control gate. When a second binary logic state is written into the floating gate, the DEIS material induces charge injection from the plate of the capacitor into the floating gate. Due to the characteristics of the DEIS layer, the above-described charge transfers will occur if the logic state to be written is the opposite of the logic state already stored on the floating gate. No charge transfer will occur if these logic states are the same. Hence, there is no need for an erasure step prior to writing a given logic state into the non-volatile portion of the non-volatile dynamic RAM of the invention.

BRIEF DESCRIPTION OF THE DRAWINGS

The foregoing and other objects, features and advantages of the present invention will become more apparent upon a detailed description of the best mode for carrying out the invention. In the description to follow, reference will be made to the accompanying drawings, in which.

BEST MODE FOR CARRYING OUT THE INVENTION

Figure 1:
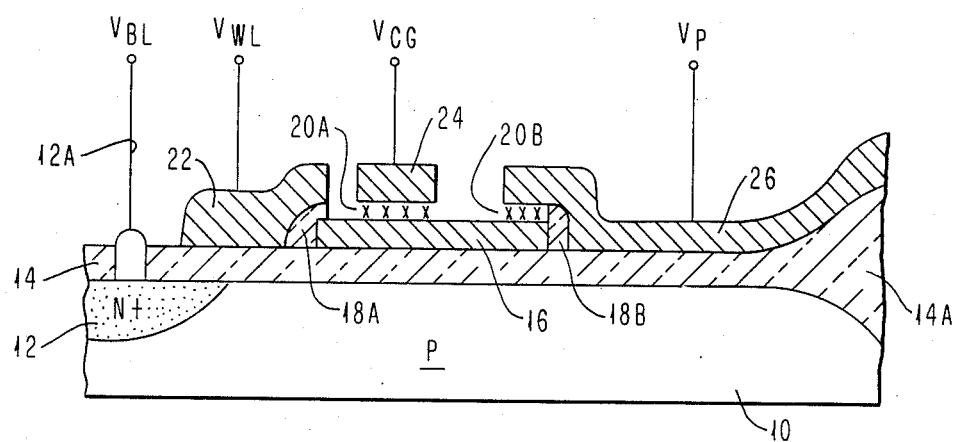
FIG. 1 is a cross-sectional view of the memory cell of the invention.

With reference to FIG. 1, the structure of the memory cell will be described. A p-type substrate 10 has an n-type diffusion 12 formed therein via typical ion implantation techniques. Note that these conductivity types are given by way of example; e.g., substrate 10 could be made of p-type silicon. The n-type region 12 constitutes a diffused bit line which is connected through a connector 12A to a bit line voltage source. Substrate 10 is covered by an oxide layer 14. A semi-recessed isolation region (S-ROX) 14A is grown during the step, using typical techniques. Insulator layer 14 is then covered by a first polycrystalline silicon layer, which is etched to form a floating gate electrode 16. A layer of DEIS material 20 is then formed on top of floating gate 16 using the techniques previously discussed. Note that the DEIS layer 20 is only formed on the upper surface of floating gate 16; the sides of the floating gate are oxidized to form conventional oxide layers 18A and 18B, respectively.

A second layer of polycrystalline silicon is deposited on the substrate. The second polysilicon layer and the DEIS layer are etched (using conventional techniques) to form a gate electrode 22 of the word line device, a first control gate including a control gate electrode 24 and a first underlying DEIS region 20A, and a second control gate including a capacitor plate 26 and a second underlying DEIS region 20B. Note that only a portion of capacitor plate 26 overlies DEIS region 20B; the remainder of plate 26 overlies insulator layer 14 to form a conventional dynamic RAM storage capacitor. The gate electrode 22 of the word line device receives a control voltage $V_{WL}$ such that the word line device acts as a switch in transferring the bit line voltage to the memory cell. The control gate electrode receives a voltage $V_{CG}$ for controlling the voltage state of floating gate 16. Finally, the capacitor plate 26 receives a control voltage $V_P$ which aids in controlling both the voltage on the storage capacitor $C_S$ and the voltage state of floating gate 16.

In FIG. 1, the size of the portion of storage plate 26 which overlays the floating gate appears to be equivalent to that of the control gate electrode 24. In practice, however, the control gate electrode 24 is larger than (i.e. elongated with respect to) the portion of storage plate 26 which overlays the floating gate. This size difference effects the respective capacitance of the respective control gates, as will be discussed in more detail below.

Figure 2A:
FIGS. 2A and 2B are schematic diagrams illustrating the conductive characteristics of the DEIS layer.
Figure 2B:
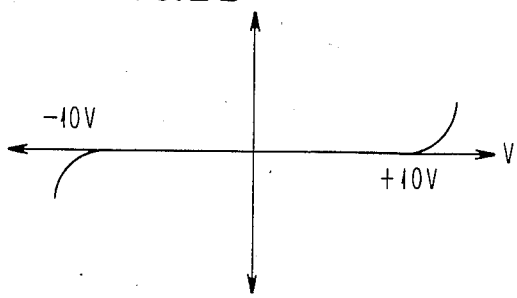

Prior to discussing the operation of the cell, the characteristic of the DEIS layer will now be reviewed. Due to the electron flow enhancement properties of the surfaces of the DEIS layer with respect to the inner $SiO_2$, each surface of the DEIS layer has an inherent diode characteristic. Since the respective surfaces of the DEIS layer promote electron flow in different directions, the total DEIS layer acts as (i.e. provides the electrical characteristic of) two back-to-back connected diodes, as shown in FIG. 2A. As shown in FIG. 2B, it is preferred that the DEIS layer be formed such that these diodes begin conduction at approximately ±10 volts. Thus, while the use of DEIS material is preferred, any sort of charge injector material or structure can be used which exhibits the above-described characteristics.

The operation of the invention will now be described with reference to FIG. 3, which shows an equivalent circuit of the cell of FIG. 1. Switch S1 represents the word line FET, which switches $V_{BL}$ onto the substrate when $V_{WL}$ goes to +5 volts. $C_{D1}$ is the capacitance formed by DEIS region 20A between control gate electrode 24 and floating gate 16; $C_{D2}$ is the capacitance formed by DEIS region 20B between polysilicon capacitor plate and floating gate 16; $C_{FGN}$ is the capacitance formed by insulator layer 14 between floating gate 16 and the substrate 10; $C_I$ is an additional inversion capacitance formed between the floating gate 16 and the substrate 10 only when a well region is induced beneath floating gate 16; and $C_S$ is the storage capacitor. For the sake of clarity, the various parasitic capacitances inherent in the memory cell have been deleted from the equivalent circuit of FIG. 3. This equivalent circuit has been found to present an accurate first order approximation of the performance of the memory cell.

Prior to describing the non-volatile aspects of the operation of the memory cell of the invention, a brief discussion will now be made of its function as a dynamic memory device. To write volatile data into the cell, $V_P$ is set at +5 volts. The control gate voltage $V_{CG}$ is set at +8 volts, which causes the floating gate voltage $V_{FG}$ to rise to ~+5 volts (due to the respective capacitive values of $C_{D1}$, $C_{D2}$ and $C_{FGN}$, as will be discussed in more detail later). After the voltage on the floating gate has stabilized, $V_{WL}$ is ramped up to +5 volts, causing the bit line voltage to be transferred via the word line device to the storage capacitor $C_S$. If $V_{BL}=0$ volts, the storage capacitor will be grounded and will thus store a "0" logic state; if $V_{BL}=+5$ volts, $C_S$ will charge to +5 volts minus Vt (the threshold of the word line device) and will thus store a "1" logic state. To read the cell, the bit line is precharged to +5 V, $V_{WL}$ is again ramped to +5 volts, and the bit line current is sensed. If the storage capacitor is storing a "0", the capacitor will charge and hence the bit line current will drop. If the capacitor is storing a "1", there will not be any bit line drop. Thus, the surface of the substrate beneath the floating gate and the capacitive plate functions as a dynamic storage node.

Figure 3:
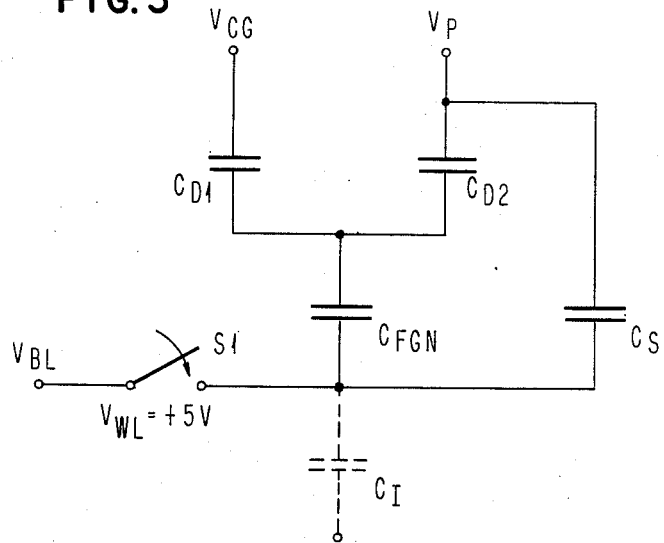
FIG. 3 is an equivalent circuit of the memory cell of the invention.

The relationships between the capacitances of the capacitors shown in FIG. 3 is as follows:

$C_{D1} \cong \frac{1}{2} C_{FGN}$
$C_{D2} \cong \frac{1}{3} C_{D1}$
$C_I \cong 0.1\ C_{FGN}$
$C_S > C_{FGN}$ These general relationships govern the operation of the cell by controlling the charge transfer through DEIS regions 20A and 20B, as will be discussed in more detail below. The difference between the capacitances of $C_{D1}$ and $C_{D2}$ is caused by the above-mentioned difference in the respective sizes of control gate 24 and the portion of capacitor plate 26 overlying DEIS region 20B.

The non-volatile aspects of the operation of the cell will now be discussed for "SAVE" and "GET" operations. The "SAVE" operation causes each of the floating gates of the memory array to store the logic states on its associated storage capacitor. The "GET" operation causes all of the floating gates to transfer its stored logic state to its associated storage capacitor. This enables the memory array to be written into and read from in the same manner as conventional dynamic storage cells (since these operations are carried out with respect to the storage capacitor and not the floating gate). It is important to note that both operations are non-destructive with respect to the transferor (e.g. after the "SAVE" operation, the capacitor still retains its stored logic state).

To perform the "SAVE" operation, $V_{WL}$ is forced to ground, $V_{BL}$ is set at $+5$ volts and the voltage on the control gate electrode is raised from $+8.5$ volts to $+20$ volts. After $V_{CG}=20V$, the voltage $V_P$ on the capacitor plate is lowered to ground. As a consequence, the potential well beneath floating gate 16 increases, and the potential well beneath capacitor plate 26 decreases. If the capacitor is storing a "0" state (i.e. no charge being stored), the inversion layer beneath the capacitor plate has its normal complement of electrons. Thus, when the potential well beneath the capacitor decreases in size, electrons will be forced to flow from beneath the capacitor plate to the larger potential well beneath the floating gate. This causes the surface of the substrate beneath the floating gate to become more negatively charged, capacitively coupling the floating gate voltage $V_{FG}$ towards ground potential. If the capacitor is storing a "1" state (i.e. $+5$ V charge storage), the inversion layer beneath the plate is depleted of free electrons. No charge transfer to the potential well beneath the floating gate takes place, allowing the floating gate voltage to vary with the control gate voltage (which is at a high level).

In general, the voltage on the floating gate can be expressed as $$V_{FG}=\chi V_{CG} \quad (1)$$

where $\chi$ is the capacitor coupling ratio. When a "0" is to be stored, $V_{CG}=+20$ V, $V_P=0$ V and $V_{sub}=0$ V, such that $$\chi\text{"0"}=C_{D1}/C_{FGT\text{"0"}}, \quad (2)$$

where $$C_{FGT\text{"0"}} \cong C_{D1}+C_{D2}+C_{FGN} \quad (3)$$

Assume that $\chi\text{"0"}\cong0.3$; thus $V_{FG}=(0.3)(20)=+6.0$ volts. Now referring back to FIG. 2B, we see that the DEIS material will conduct where the difference between either $V_{CG}$ and $V_{FG}$ or $V_P$ and $V_{FG}$ is greater than 10 volts. In this situation, $V_{CG}-V_{FG}=20-6=14$ volts. Thus, DEIS region 20A associated with control gate electrode 24 will conduct, removing charge from floating gate 16 and injecting the charge into control gate electrode 24. This charge transfer will continue until the voltage on the floating gate rises from $+6.0$ V to 10 volts. The net charge gain by the floating gate can be expressed as $$Q_{FG\text{"0"}}=(V_{FGf}-V_{FGi})C_{FGT\text{"0"}} \quad (4)$$

where $V_{FGi}=+6V$ and $V_{FGf}=+10V$. Thus, the potential due to the floating gate charge is $Q_{FG\text{"0"}}/C_{FGT}=+4V$, since $C_{FGT}=C_{FGT\text{"0"}}$.

If a "1" is to be stored, recall that the inversion layer beneath the floating gate is floating due to a lack of electron flow from the inversion layer of the storage capacitor. This creates a depletion capacitance $C_I$ between the floating gate capacitor $C_{FGN}$ and the substrate. Thus, $$\chi\text{"1"} \cong \frac{C_{D1}}{C_{D1}+C_{D2}+\frac{(C_{FGN})(C_I)}{C_{FGN}+C_I}}, \quad (5)$$

Assuming $\chi\text{"1"}\cong0.7$, $V_{FG}=(0.7)(20)=+14$ volts. Thus, with reference to FIG. 2B, it is apparent that $-4.0$ volts of charge will be injected into the floating gate by the capacitor plate 26 via DEIS region 20B. Again, the net charge gain by the floating gate is $$Q_{FG\text{"1"}}=(V_{FGf}-V_{FGi})C_{FGT\text{"1"}}$$

where $$C_{FGT\text{"1"}} \cong C_{D1}+C_{D2}+\frac{(C_{FGN})(C_I)}{C_{FGN}+C_I}, \quad (6)$$

and the final potential of the floating gate due to this charge is $Q_{FG\text{"1"}}/C_{FGT}=-4$ volts.

Thus, the floating gate will store a $+4V$ charge when storing a "0" and a $-4V$ charge when storing a "1".

A feature of disclosed memory cell is that the dynamically stored data can be read (by the coupling of the data signals to the storage capacitor) without concern that the negatively charged floating gage will impede channel formation. As discussed above, the charge on the floating gate is $-4$ V when storing a "1" state. This high negative charge may be sufficient to at least partially decouple the voltage developed on the bit line from the storage capacitor by prohibiting channel formation. However, when we want to "read" the logic state stored on the capacitor and the floating gate stores a "1", the depletion capacitance $C_I$ will be removed since the inversion layer beneath the floating gate no longer floats (i.e. it is receiving electrons from the word line device). As a result, the voltage due to the stored charge will drop from $-4$ V ($=Q_{FG}/C_{FGT\text{"1"}}$) to $-1.8$ V ($=Q_{FG}/C_{FGT\text{"0"}}$), and thus the floating gate will not impede channel formation to a degree which would prevent a proper "read" cycle.

The foregoing description of the non-volatile operation of the cell was made with the assumption that the floating gate was devoid of charge when the writing operation was initiated. A feature of the invention is that new data can be written over the old data stored on the floating gate without the need for an intervening erasure of the old data. This feature will now be discussed in more detail. During the discussion, reference will be made to the following relationship:

$$V_{FGN}=V_{FGO}+V_{FGW}$$

where
$V_{FGN}=$ the new voltage of the floating gate at the end of the present writing step;
$V_{FGW}=$ the voltage on the floating gate at the end of the present writing step, assuming no previous floating gate charge; and
$V_{FGO}=$ the voltage on the floating gate due to the previous charge storage from an immediately preceding writing step.

(a) Cell at "0" state, write in a "0":

Under these circumstances, the voltage on the floating gate $V_{FGN}=(+6\ V)+(+4\ V)=+10$ volts. That is, assuming no previous charge storage, the floating gate will be at $+6$ volts when storing a "0"; furthermore, due to the charge transfer in storing a prior "0", the floating gate already has $+4.0$ volts of charge stored thereon. Therefore, since the floating gate is at $+10$ volts, there will not be any charge injection, and the voltage on the floating gate will still be $+4$ volts.

(b) Cell at "1" state, write in a "0":

Here, $V_{FGN}=(-4\ V)+(+6\ V)=+2\ V$. The $-4$ volts is due to the charge injected on the floating gate in storing a "1" previously, and the $+6$ V is due to the present writing of a "1". Thus, there will be $+8$ volts worth of charge removal from the floating gate to control gate electrode 24, and the final voltage of the floating gate will be $V_{FG}=(-4\ V)+(+8\ V)=+4\ V$.

(c) Cell at "0" state, write in a "1":

Initially, $V_{FGN}=(+4\ V)+(+14\ V)=+18$ volts, such that $-8$ V worth of charge will be injected into the floating gate and $V_{FG}=(+4.5)+(-8\ V)=-4$ volts.

(d) Cell at "1" state, write in a "1":

$V_{FGN}=(-4\ V)+(+14\ V)=+10$ volts, such that no charge injection occurs and $V_{FG}$ still $=-4$ volts.

Once the above-described "SAVE" operation has been completed, the charge on the floating gate is indicative of the logic state on the storage capacitor. Since the charge stored on the capacitor is no longer important, the memory array does not have to be periodically refreshed. In order to read the cell by conventional DRAM techniques, the charge stored on the floating gate must now be transferred back to the storage capacitor. In this "GET" operation, a "1" is first written into all of the cells of the array by raising the bit line voltage $V_{BL}$ to $+5$ volts and then raising the word line voltage $V_{WL}$ to $+5$ volts, while keeping $V_{CG}=8.5$ V and $V_P$ at $+5$ volts. As a result, the storage capacitor will be charged to $+5V-V_T$ of the word line device. Note that this step can be completed concurrently with a conventional DRAM refresh cycle by forcing the bit line to $+5$ V.

Then, the control electrode 24 is grounded ($V_{CG}=0$), the bit line is grounded ($V_{BL}=0$), and then the word line 22 is raised to $+5$ volts. The floating gate potential is due only to the charge stored on the floating gate. If the floating gate is positively charged (i.e. storing a "0" state), a channel will be induced below the floating gate, and the voltage of the inversion layer beneath the capacitor will be forced to the bit line voltage (i.e. ground). Hence, for a "0" stored on the floating gate, the capacitor voltage is at ground after the "GET" operation. On the other hand, for a stored "1", the negative charge on the floating gate will prohibit channel formation, and hence the inversion layer of the capacitor will remain at $+5$ volts after the "GET" operation. Again, this step can be concurrent with a conventional DRAM refresh cycle by forcing the bit line to 0V.

The non-volatile dynamic memory of the invention can be implemented with a minimum of support circuitry. Only one control voltage ($V_{CG}$) rises above $V_{DD}=+5$ volts. Moreover, the memory cell of the invention is of relatively simple construction, and hence does not require a large number of processing steps in order to construct.

Further, the non-volatile portion of the memory cell has an overwrite capability. That is, new data can be written into the floating gate without first erasing the previously stored logic state. This elimination of the intervening erase step improves the overall storage cycle time of the cell.

It is to be understood that both structural and operational modifications can be made to the best mode for carrying out the invention as described above without departing from the spirit and scope of the invention.

What is claimed is:

1. A non-volatile dynamic memory cell, comprising:
   a semiconductor substrate of a first conductivity type having a first surface portion which functions as a dynamic storage node for storing first and second logic states a first surface region of a second conductivity type, and a second surface portion disposed between said first surface portion and said first surface region;
   a transfer device for selectively coupling data signals between said first surface portion and said first surface region;
   a floating gate electrode disposed on and insulated from said second surface portion said substrate;
   first and second charge injection means disposed on said floating gate electrode for injecting charge into and removing charge from respectively, said floating gate electrode, each of said first and second charge injection means comprising a layer of silicon oxide having excess silicon crystals on its upper and lower surfaces; and
   first and second control electrodes disposed on said first and second charge injection means, respectively, said first and second control electrodes receiving first and second control signals, respectively, for initiating said charge transfer by said first and second charge injection means, respectively, such that said first charge injection means removes charge from said floating gate electrode when said first logic state is to be stored by said floating gate electrode and said second charge injection means injects charge into said floating gate electrode when said second logic state is to be stored by said floating gate electrode, as a function of the voltage on said first surface portion as well as the charge previously stored by said floating gate electrode, to overwrite said first and second logic states into said floating gate electrode.

2. The memory cell as recited in claim 1, wherein said first surface region comprises a diffused bit line.

3. The memory cell as recited in claim 1, wherein said transfer device comprises a word line device having a gate electrode insulated from and overlaying said semiconductor substrate, said diffused bit line comprising a drain electrode of said word line device.

4. The memory cell as recited in claim 1, wherein said floating gate electrode is comprised of a first layer of polycrystalline silicon, and wherein said first and second control electrodes are comprised of a second layer of polycrystalline silicon.

5. The memory cell is recited in claim 3, wherein said gate electrode of said word line device is comprised of said second layer of polycrystalline silicon.

6. The memory cell as recited in claim 1, wherein each of said first and second charge injection means initiate charge transfer when a differential voltage of greater than $+10$ volts or less than $-10$ volts is applied thereto.

7. The memory cell as recited in claim 1, wherein each of said first and second charge injection means comprises a layer of silicon oxide having excess silicon crystals on its upper and lower surfaces.

8. The memory cell as recited in claim 1, further comprising a storage plate electrode disposed on and insulated from said dynamic storage node.

9. The memory cell as recited in claim 8, wherein said storage plate electrode and one of said first and second control electrodes are electrically in common.

10. A memory cell for storing data in volatile and non-volatile forms, the non-volatile storage having an overwrite capability, comprising:

a semiconductor substrate of a first conductivity type having a first surface portion which comprises a dynamic storage node for storing first and second logic states, a first surface region of a second conductivity type which comprises a diffused bit line, and a second surface portion disposed between said first surface portion and said first surface region;

a transfer device having a gate electrode disposed on and insulated from said semiconductor substrate, said transfer device selectively coupling data signals between said first surface portion and said first surface region to control the logic state stored by said first surface portion;

a non-volatile storage means disposed on and insulated from said second surface portion; and first and second control gates disposed on said non-volatile storage means and receiving first and second control signals, respectively, each of said first and second control gates comprising a layer of silicon oxide having excess silicon crystals on its upper and lower surfaces overlaid by a layer of conductive material, said first control gate removing charge from said non-volatile storage means when said first surface portion of said substrate is storing a first voltage indicative of said first logic state, and said second control gate injecting charge into said non-volatile storage means when said first region of said substrate is storing a second voltage indicative of said second logic state, said charge injection or charge removal also being a function of the charge previously stored by said non-volatile storage means so that said logic states are overwritten from said dynamic storage node into said non-volatile storage means.

11. The memory cell as recited in claim 10, further comprising a storage plate electrode disposed on and insulated from said dynamic storage node.

12. The memory cell as recited in claim 11, wherein each of said first and second control gates comprises a layer of charge injector material formed on said non-volatile storage means and a layer of polysilicon overlaying said charge injector material.

13. The memory cell as recited in claim 12, wherein said layer of charge injector material comprises a layer of silicon oxide having excess silicon crystals on its upper and lower surfaces.

14. A semiconductor memory cell formed on a semiconductor substrate, the cell being capable of storing data in non-volatile and dynamic forms, comprising:

a transfer device for selectively coupling data signals between a data line and a dynamic storage node on the surface of a semiconductor substrate;

a floating gate electrode insulated from and overlying a portion of said semiconductor substrate between said transfer device and said dynamic storage node;

first and second charge injection means overlying first and second regions of said floating gate electrode for injecting charge into and removing charge from, respectively, said floating gate electrode, each of said first and second charge injection means comprising a layer of silicon oxide having excess silicon crystals on its upper and lower surfaces;

first and second control electrodes disposed on said first and second charge injection means, respectively, for writing new data from said dynamic storage node into said floating gate electrode by initiating charge transfer between one or the other of said first and second charge injection means and said floating gate electrode in response to (a) independent control signals received by said first and second control electrodes, respectively, and (b) the previously stored charge on said floating gate electrode, said new data being overwritten into said floating gate electrode.

15. The memory cell as recited in claim 14, wherein said data line comprises a diffused bit line and said transfer device comprises a word line device, said diffused bit line comprising a drain electrode of said word line device.

16. The memory cell as recited in claim 14, wherein said first control electrode further comprises a storage capacitor plate insulated from and overlaying said dynamic storage node.

17. The memory cell as recited in claim 14 wherein said layer of charge injector material comprises a layer of silicon oxide having excess silicon crystals on its upper and lower surfaces.

18. A semiconductor memory cell capable of storing binary data in volatile and non-volatile forms, comprising:

a storage capacitor comprising a semiconductor substrate having a dynamic storage node for storing first and second binary logic states on a surface thereof and a storage capacitor plate formed above and insulated from said dynamic storage node;

a word line device formed on said surface of said semiconductor substrate for coupling data signals between a data line formed on said surface of said substrate and said dynamic storage node;

a floating gate electrode formed on and insulated from a portion of said surface of said semiconductor substrate between said storage capacitor and said word line device;

first and second charge injection means formed on separate regions of said floating gate electrode, said first and second charge injection means being capable of injecting charge into and removing charge from said floating gate electrode, each of said first and second charge injection means comprising a layer of silicon oxide having excess silicon crystals on its upper and lower surfaces; and first and second control electrodes disposed on said first and second charge injection means, respectively, said first and second control electrodes receiving first and second control signals, respectively, such that said first charge injection means removes charge from said floating gate electrode when a first binary logic state is to be stored by said floating gate electrode and said second charge injection means injects charge into said floating gate electrode when a second logic state is to be stored by said floating gate electrode, said charge removal or charge injection also being a function of the binary logic state currently stored by said floating gate electrode, such that said binary logic states may be overwritten into said floating gate electrode.

19. The memory cell as recited in claim 18, wherein each of said first and second charge injection means initiate charge transfer when a differential voltage of greater than +10 volts or less than −10 volts is applied thereto.

20. A memory cell storing logic data in volatile and non-volatile forms, the non-volatile storage having an overwrite capability, comprising:

a storage capacitor comprising a semiconductor substrate having a dynamic storage node on a surface thereof and a storage capacitor plate formed above and insulated from said dynamic storage node;

a transfer device formed on said surface of said semiconductor substrate, said transfer device having a drain electrode comprising a diffused bit line, said transfer device selectively coupling data signals between said diffused bit line and said dynamic storage node;

a floating gate electrode formed above and insulated from a portion of said semiconductor substrate between said transfer device and said storage capacitor;

first and second charge injection means formed on separate regions of said floating gate electrode, said first and second charge injection means being capable of injecting charge into and removing charge from, respectively, said floating gate electrode, each of said first and second charge injection means comprising a layer of silicon oxide having excess silicon crystals on its upper and lower surfaces; and first and second control electrodes disposed on said first and second charge injector means, respectively, said second charge injector means, respectively, said second control electrode being electrically in common with said storage capacitor plate, said first and second control electrodes receiving independent control voltages such that either one of said charge injection means injects charge into said floating gate electrode or the other of said charge injection means removes charge from said floating gate electrode, as a function of a pre-existing charge on said floating gate electrode and the logic state of said dynamic storage node, whereby said first and second charge injector means are prohibited from performing either said charge injection or said charge removal when the logic state to be stored by said floating gate electrode is the same as the logic state currently stored thereon.

* * * * *